United States Patent [19]

Takata et al.

[11] Patent Number: 4,626,704
[45] Date of Patent: Dec. 2, 1986

[54] VOLTAGE LEVEL CONVERTING CIRCUIT

[75] Inventors: Akira Takata, Toyonaka; Toyofumi Takahashi, Ikeda, both of Japan

[73] Assignee: Ricoh Company, Ltd., Japan

[21] Appl. No.: 724,793

[22] Filed: Apr. 19, 1985

Related U.S. Application Data

[63] Continuation-in-part of Ser. No. 471,859, Mar. 3, 1983, abandoned.

[30] Foreign Application Priority Data

Mar. 4, 1982 [JP] Japan .................................. 57-34769

[51] Int. Cl.[4] ............................................. H03K 5/00
[52] U.S. Cl. .................................... 307/264; 307/350; 323/299
[58] Field of Search ............... 307/296 R, 296 A, 451, 307/475, 570, 585, 279, 350, 264; 323/223, 225, 226, 311, 299; 365/226; 363/62, 123, 147

[56] References Cited

U.S. PATENT DOCUMENTS

| | | | |
|---|---|---|---|
| 3,904,888 | 9/1975 | Griffin et al. | 307/279 |
| 4,024,415 | 5/1977 | Matsuura | 307/585 |
| 4,152,716 | 5/1979 | Torii et al. | 323/225 |
| 4,375,596 | 3/1983 | Hoshi | 307/296 |
| 4,464,587 | 8/1984 | Suzuki et al. | 307/279 |
| 4,469,960 | 9/1984 | Raghunathan | 307/296 R |
| 4,521,696 | 6/1985 | Raghunathan | 307/350 |

Primary Examiner—Patrick R. Salce
Assistant Examiner—Jeffrey L. Sterrett
Attorney, Agent, or Firm—Guy W. Shoup

[57] ABSTRACT

A voltage level converting circuit for use in semiconductor devices including memory such as ROMs, PROMs and EPROMs comprises an input terminal to which an input signal is applied, a voltage level detecting circuit for detecting the voltage level of the input signal received by the input terminal and supplying an output signal of the voltage level determined in response to the level of the input signal, an inverter connected to the voltage level detecting circuit and a CMOS device having a pair of outside source/drain terminals connected between the input terminal and a first reference voltage, a gate terminal connected to the output of the inverter and the inner interconnected source/drain terminals connected to an output terminal of the circuit.

12 Claims, 25 Drawing Figures

Fig. 4    Fig. 5
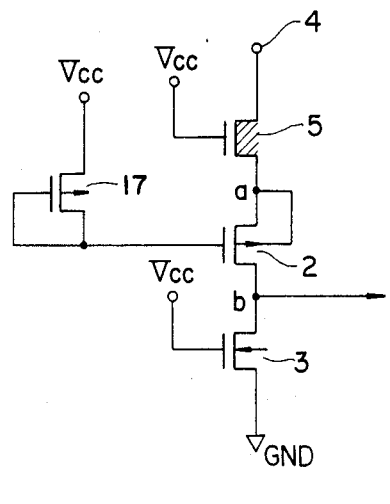
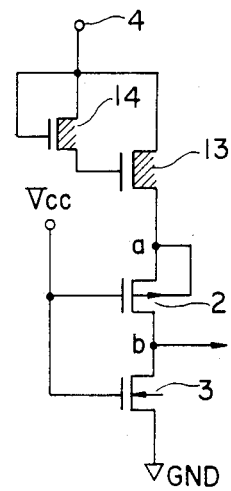
Fig. 6
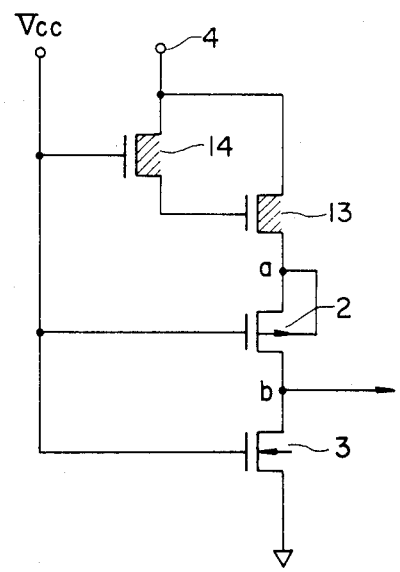

VOLTAGE LEVEL CONVERTING CIRCUIT

CROSS-REFERENCES TO RELATED APPLICATIONS

This is a continuation-in-part of application Ser. No. 471,859, filed Mar. 3, 1983, now abandoned.

BACKGROUND OF THE INVENTION

1. Field of the Invention

This invention generally relates to a semiconductor device, and, in particular, to a semiconductor memory device. More specifically, the present invention relates to a voltage level converting circuit for converting the voltage level of an input signal to a desired level, which is particularly suited for use in semiconductor memory devices. Still more specifically, the present invention relates to a semiconductor level converting circuit including Complementary MOS devices.

2. Description of the Prior Art

In Erasable Programmable Read Only Memory (PROM) devices, three voltages $V_{IL}$, $V_{IH}$ and $V_{PP}$ different in level are selectively applied to one of the connection pins, which is normally indicated by the $\overline{OE}/V_{PP}$ pin, because of the limited number of connection pins. During program and program inhibit modes, voltage $V_{PP}$ is applied; whereas, during read, stand-by, verify and output inhibit modes, either one of voltages $V_{IL}$ and $V_{IH}$ is selectively applied. In such EPROMs, provision is usually made of a voltage level converting circuit in order to allow to output $V_{PP}$ with a minimum voltage drop when the voltage $V_{PP}$ is applied and to convert the output voltage level to 0 volt when voltage $V_{IL}$ or $V_{IH}$ is applied so as to maintain the power dissipation as small as possible. However, as the density of memory devices increases due to recent developments in semiconductor technology, it is desired to still decrease the level of power dissipation.

SUMMARY OF THE INVENTION

In accordance with the present invention, there is provided a voltage level converting circuit which is extremely low in power dissipation and simple in structure. Two or more input signals differing in level may be applied to the present voltage level converting circuit which allows to output the input signals maintaining the original voltage levels or the voltage levels substantially equal to the original voltage levels when the voltage levels of the input signals are equal to or higher than a predetermined voltage level and which supplies a low voltage, e.g., 0 voltage, level output signal when the voltage levels of the input signals are lower than the predetermined voltage level. The present voltage level converting circuit is characterized by being so structured to minimize the power dissipation by limiting the current passing through the circuit, particularly the steady-state or quiescent current.

In accordance with one aspect of the present invention, the present voltage level converting circuit comprises an input terminal to which input signals having different voltage levels may be applied; voltage level detecting means connected to said input terminal for detecting the voltage levels of said input signals and supplying a high level output signal when the input signal has been detected to be equal to or higher than a predetermined voltage level or a low level output signal when the input signal has been detected to be lower than the predetermined voltage level; inverting means having an input and output, said input of said inverting means being connected to said voltage level detecting means for inverting the polarity of the output signal supplied from said voltage level detecting means; and a CMOS device including a pair of P-channel and N-channel MOSFETs which are connected in series between said input terminal and a reference voltage, the gates of said P-channel and N-channel MOSFETs being connected to said output of said inverting means and the junction between said P-channel and N-channel MOSFETs being connected to an output terminal of said circuit. Preferably, the reference voltage is set at the ground level.

It is therefore a primary object of the present invention to provide an improved semiconductor device.

Another object of the present invention is to provide a semiconductor memory device which is extremely low in power dissipation.

A further object of the present invention is to provide a fast-speed and low power voltage level converting circuit.

A still further object of the present invention is to provide a voltage level converting circuit which is limited in the occurrence of current passing through the circuit thereby allowing to minimize power dissipation.

A still further object of the present invention is to provide a voltage level converting circuit which is particularly suited for use in a high density memory device.

Other objects, advantages and novel features of the present invention will become apparent from the following detailed description of the invention when considered in conjunction with the accompanying drawings.

BRIEF DESCRIPTION OF THE DRAWINGS

FIGS. 2 through 6 are circuit diagrams showing several examples of the voltage level detecting circuit forming a part of the voltage level converting circuit of FIG. 1;

DESCRIPTION OF THE PREFERRED EMBODIMENTS

Figure 1:
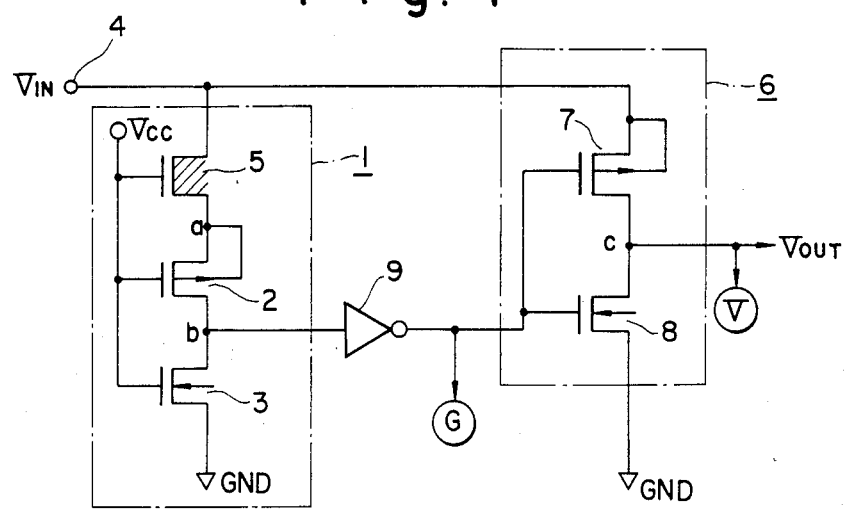
FIG. 1 is a circuit diagram showing the voltage level converting circuit constructed in accordance with one embodiment of the present invention.

Referring now to FIG. 1, the present voltage level converting circuit includes a voltage level detecting circuit 1 which includes a Complementary Metal-Oxide-Semiconductor (CMOS) structure comprised of a P-channel MOSFET 2 and an N-channel MOSFET 3 which are connected in series. The ratio of channel width to channel length for these MOSFETs is determined such that the on resistance of MOSFET 3 is substantially larger than the on resistance of MOSFET 2. The voltage level detecting circuit 1 also includes a depletion type N-channel MOSFET 5 which is connected between the MOSFET 2 and an input terminal 4 of the present voltage level converting circuit. These MOSFETs 2, 3 and 5 have their gates connected to receive a common supply voltage $V_{CC}$, e.g., 5 volts. The voltage level converting circuit also includes a CMOS device 6 comprised of a pair of a P-channel MOSFET 7 and an N-channel MOSFET 8 which are connected in series through their drains. The source of P-channel MOSFET 7 is connected to the input terminal 4; whereas, the source of N-channel MOSFET 8 is connected to a reference voltage, or the ground voltage GND in the illustrated example. The voltage level converting circuit further includes an inverter 9 having its input connected to the node or junction b between MOSFETs 2 and 3 and its output connected to the gates of MOSFETs 7 and 8, as shown. The node c which is the interconnection between MOSFETs 7 and 8 defines an output terminal of the present voltage level converting circuit.

The operation of the present circuit shown in FIG. 1 will be described assuming that input signals having three different voltage levels, i.e., $V_{IL}$ (0.8 volts or lower), $V_{IH}$ (2.0−5.5 volts) and $V_{PP}$ (25±1 volts), are applied to input terminal 4, as an example. When voltage $V_{PP}$, which is higher than voltage $V_{CC}$, is applied to input terminal 4, depletion type N-channel MOSFET 5 is rendered non-conductive, so that a voltage of (supply voltage $V_{CC}$)−(the effective threshold voltage of MOSFET 5) appears at node a which is the interconnection between MOSFETs 5 and 2. It is to be noted that the "effective threshold voltage" is a voltage corrected against an increase in threshold voltage due to the source-body effect. If MOSFET 5 used has the threshold of approximately −3 volts, the voltage at node a will be approximately 7 volts, and, thus, both MOSFETs 2 and 3 are turned on, thereby setting the voltage at node b between MOSFETs 2 and 3 to be high level (Hi) as determined by the ratio of on resistances between MOSFETs 2 and 3. Accordingly, the Hi is converted into a low level signal (Lo) by inverter 9 and thus Lo is applied to the gates of MOSFETs 7 and 8 of CMOS 6. This causes MOSFET 7 to be on and MOSFET 8 to be off so that the input signal $V_{PP}$ appears at node c as supplied from input terminal 4 through MOSFET 7 substantially maintaining the original voltage level.

On the other hand, when voltage $V_{IL}$ or $V_{IH}$ is applied to input terminal 4, MOSFET 5 is turned on and its voltage appears at node a, thereby causing MOSFET 2 to be turned off and MOSFET 3 to be turned on so that the voltage at node b is set low since node b is connected to ground through MOSFET 3. Accordingly, Hi is applied to the gates of CMOS 6 through inverter 9, and, thus, MOSFET 8 is turned on and MOSFET 7 is turned off thereby setting the voltage at node c to be Lo because node c is connected to ground through MOSFET 8. It is to be noted that a high voltage level input signal which is equal to or higher than a predetermined voltage level and which may be applied to the present circuit is not limited to input signal $V_{PP}$ and any other high voltage level signal may be applied.

Figure 2:
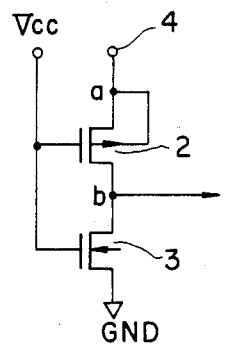

FIG. 2 shows a modification of voltage level detecting circuit 1, and, as shown, this circuit is constructed by removing MOSFET 5 from the circuit 1 shown in FIG. 1. When a high voltage input signal such as $V_{PP}$ is applied to input terminal 4, MOSFETs 2 and 3 are both turned on so that the voltage at node b becomes Hi as determined by the ratio in on resistance between MOSFETs 2 and 3. On the other hand, when the voltage level of an input signal applied to input terminal 4 is lower than the voltage of (supply voltage)−(threshold voltage of MOSFET 2), MOSFET 2 is turned off and MOSFET 3 is turned on to cause the voltage at node b to be Lo. Thus, the voltage level converting circuit having its level detecting circuit 1 substituted by the level detecting circuit of FIG. 2 functions exactly in the same manner as the circuit of FIG. 1. That is, when $V_{PP}$ is supplied as an input signal, $V_{PP}$ is supplied as an output; whereas, when $V_{IL}$ or $V_{IH}$ is supplied as an input, a predetermined low level signal is supplied as an output. It should be noted, however, that the voltage level detecting circuit of FIG. 2 is more susceptible to latch-ups because high voltages are applied to the N-well in which MOSFET 2 is formed and to the drain of MOSFET 3. For this reason, when the structure of FIG. 2 is to be used, it is preferable to provide a relatively wide gap between MOSFETs 2 and 3 and/or to provide guard regions inside and outside of the N-well, paying attention not to arrange other MOSFETs in the vicinity of MOSFET 2. It should further be noted that such measures against latch-ups are preferably provided for CMOS 6 in the circuit of FIG. 6.

Figure 3:
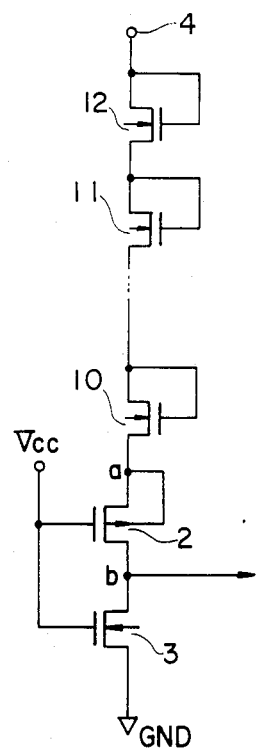

FIG. 3 shows another modification of the voltage level detecting circuit 1 of FIG. 1. As shown, in this embodiment, depletion type N-channel MOSFET 5 of FIG. 1 is substituted by a plurality of enhancement type N-channel MOSFETs 10, 11, . . . , 12 which are connected in series. The voltage drop of the combined threshold voltage across the serially connected MOSFETs 10, 11, . . . , 12 is utilized to decrease the level of the voltage to be applied to MOSFETs 2 and 3. In this embodiment, by adjusting the number of MOSFETs 10, 11, . . . , 12 to be provided, the level of the voltage applied to MOSFETs 2 and 3 may be set at an appropriate level as desired.

FIG. 4 shows a further modification of the voltage level detecting circuit which is constructed by providing P-channel MOSFET 17 having its gate and source connected to the gate of MOSFET 2 so as to lower the gate voltage of MOSFET 2 by a single threshold voltage drop to the circuit 1 of FIG. 1. Provision of MOSFET 17, in effect, causes to lower the resistance of MOSFET 2 which then increases an amount of current to be flowed in thereby increasing the switching speed of MOSFET 2. FIG. 5 shows a still further modification of the voltage level detecting circuit which is constructed by having MOSFET 5 of the circuit 1 in FIG. 1 substituted with a pair of depletion type N-channel MOSFETs 13 and 14. As shown, MOSFET 13 is provided as connected between input terminal 4 and node a and MOSFET 14 is provided as connected between input terminal 4 and the gate of MOSFET 13 with the gate of MOSFET 14 connected to input terminal 4. By providing MOSFETs 13 and 14 as connected as shown, the voltage at node a may be set at a level somewhat higher than that in the circuit of FIG. 1. With such a structure, the impedance of MOSFET 2 is effectively lowered so that the switching speed of MOSFET 2 may be enhanced.

FIG. 6 shows a still further modification of the voltage level detecting circuit which is similar in structure to the circuit of FIG. 5. That is, the voltage level detecting circuit of FIG. 6 also includes a pair of depletion type N-channel MOSFETs 13 and 14. Similarly with the embodiment of FIG. 5, MOSFET 13 is connected between input terminal 4 and node a and MOSFET 14 is connected between input terminal 4 and the gate of MOSFET 13. In the embodiment of FIG. 6, the gate of MOSFET 14 is not connected to input terminal 4, but instead connected to receive supply voltage $V_{CC}$. This structure also allows to set the voltage level at node a to a desired level.

As described above, the present voltage level converting circuit includes a voltage level detecting circuit and an output stage either of which includes a CMOS device. For example, the output stage is comprised of CMOS device 6 including P-channel MOSFET 7 and N-channel MOSFET 8 either one of which is maintained off thereby preventing the occurrence of passing-through current which passes through the present circuit. In the voltage level detecting circuit 1, when the voltage level of an input signal is equal to or above a predetermined voltage level, a slight passing-through current will occur; however, in the case where the voltage level of an input signal is below the predetermined level, no passing through current will occur because MOSFET 2 is turned off. Consequently, the present voltage level converting circuit has an extremely small power dissipation because of absence of steady-state or quiescent current and a high speed characteristic.

Figure 24:
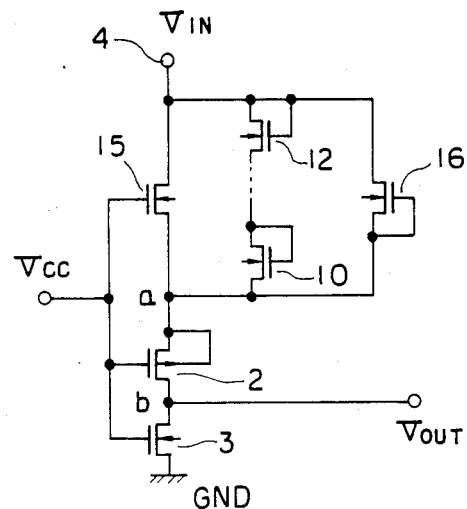
FIGS. 24 and 25 are circuit diagrams showing two further alternative structures of voltage detecting circuit constructed in accordance with the principle of the present invention.

FIG. 24 shows a further embodiment of the level detecting circuit which is an improvement over the structure shown in FIG. 3. In the structure shown in FIG. 24, a plurality of series-connected N-channel MOSFETs 10–12 are connected between the input terminal 4 and the node a, and an N-channel MOSFET 16 is also provided as connected in parallel with the series-connected N-channel MOSFETs 10–12. Although two of the series connected MOSFETs 10–12 are shown in fig. 24, the number of such N-channel MOSFETs 10–12 may be determined appropriately depending on particular applications. For example, only one such N-channel MOSFET may be provided if a desired voltage drop may be obtained.

Described more in detail with respect to the structure shown in FIG. 24, the N-channel MOSFET 16 has its one source/drain region connected to the input terminal 4, its other source/drain region connected to node a, and its gate also connected to node a. With the provision of such an additional N-channel MOSFET 16, even in the case when the MOSFETs 10–12 are rendered non-conductive due to the fact that the level of input voltage $V_{IN}$ at the input terminal 4 has changed from a high voltage level to a relatively low voltage level, the MOSFET 16 remains conductive thereby providing a bypass circuit, so that the charge accumulated at the node a may be discharged to the input terminal $V_{IN}$ through the MOSFET 16 in the conductive state. Thus, the structure of FIG. 24 allows to respond to changes in the state of input voltage $V_{IN}$ quickly thereby allowing to prevent a faulty operation from taking place.

In the level detecting circuit shown in FIG. 24, another N-channel MOSFET 15 is provided as connected between the input terminal 4 and the node a. The MOSFET 15 has its one source/drain region connected to the input terminal 4, its other source/drain region connected to the node a, and its gate connected to supply voltage $V_{CC}$. Since the gate of MOSFET 15 is connected to supply voltage $V_{CC}$, the MOSFET 15 is maintained conductive so that when the input signal $V_{IN}$ becomes 0 V, the voltage level at node a is set at 0 V, thereby preventing the node a from floating. With this structure, since the N-well for MOSFET 2 is prevented from becoming electrically floated, the circuit may operate stably.

In the level detecting circuit shown in FIG. 24, the high voltage detecting threshold is determined by reference voltage+threshold voltage of MOSFET 2+(threshold voltage of MOSFETs 10–12)×(number of MOSFETs 10–12). Thus, in accordance with the structure shown in FIG. 24, the high voltage detecting threshold may be set arbitrarily at a high level by appropriately selecting the threshold voltage of each of MOSFETs 10–12 and the number of such MOSFETs 10–12. Besides, with the provision of bypass MOSFET 16, the charge accumulated at node a may be removed quickly so that the present circuit is prevented from carrying out a faulty operation even when the input signal $V_{IN}$ changes its level from a high voltage level to a low voltage level. Furthermore, between the node a and ground is serially connected a pair of MOSFETs 2 and 3 in the form of CMOS structure with an output being supplied from the junction between these two MOSFETs 2 and 3, and, therefore, the push-pull operation provided by these two MOSFETs 2 and 3 also allows to lower power consumption.

Figure 25:
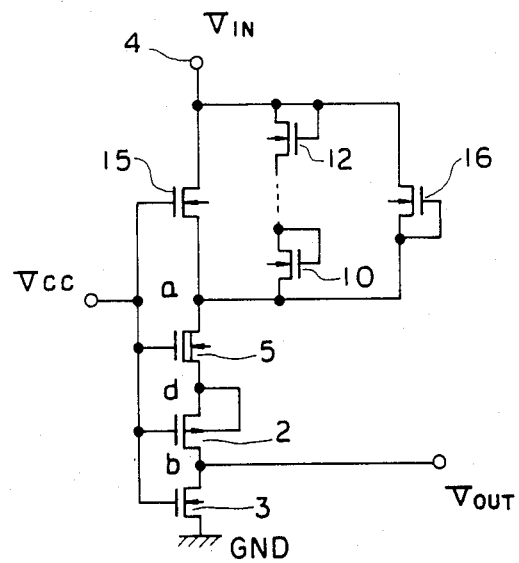

As may be understood, in the structure shown in FIG. 24, the voltage at node a increases proportionately as the input voltage $V_{IN}$ increases. If it is desired to place an upper limit for the excursion of voltage at node a, it is only necessary to provide a depletion-type MOSFET 5 as connected between the node a and the MOSFET 2, as shown in FIG. 25. That is, in the level detecting circuit shown in FIG. 25, the depletion-type N-channel MOSFET 5 has its source/drain region connected to node a, its other source/drain region connected to one source/drain region of MOSFET 2, and its gate connected to voltage supply $V_{CC}$. With this structure, even if the voltage at node a increases proportionately as the input voltage $V_{IN}$ increases, the voltage at node d may be prevented from increasing beyond a predetermined level. However, since the structure of FIG. 25 contains the depletion-type MOSFET 15 additionally as compared with the structure of FIG. 24, an additional step of ion implantation is required and thus the number of manufacturing steps is increased.

Figure 7:
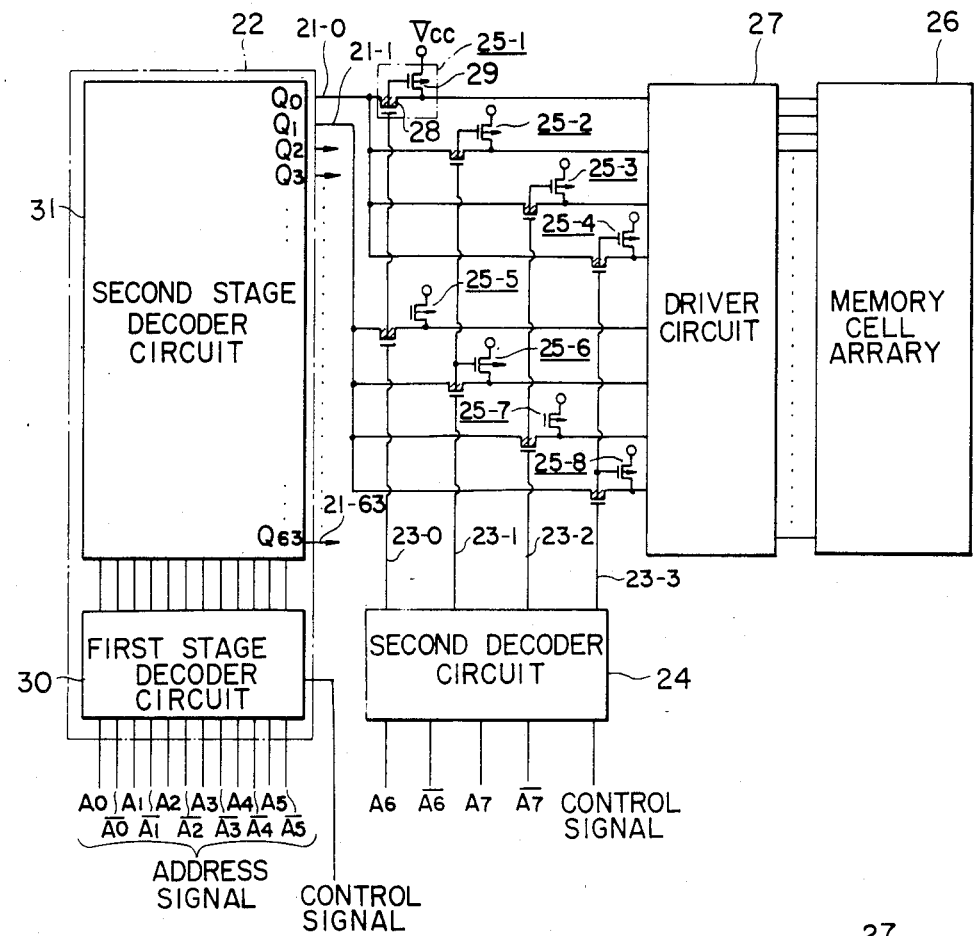
FIG. 7 is a circuit diagram partly in blocks showing the overall structure of the peripheral circuit of a semiconductor memory device such as ROM, PROM and EPROM.

FIG. 7 schematically shows the overall structure of a semiconductor memory device such as a ROM, PROM or EPROM, which is basically comprised of a memory cell array 26 and a peripheral circuit for accessing a desired memory cell in memory cell array 26 which includes decoder circuits 22 and 24 and a driver circuit 27 and which is particularly suited for use with the above-described voltage level converting circuit. As shown, the peripheral circuit includes a first decoder circuit 22 for selectively activating first signal lines 21-0 through 21-63 in response to first address signals $A_0$ through $A_5$ and first control signal B, and it also includes a second decoder circuit 24 for selectively activating second signal lines 23-0 through 23-3 which extend perpendicularly to the first signal lines in response to second address signals $A_6$ and $A_7$ and second control signal CE. Also provided in the peripheral circuit are gate circuits 25-1 through 25-256 (gate circuits 25-1 through 25-8 are only shown) each provided at the intersections between the first and second signal lines. The peripheral circuit further includes a driver circuit 27 having basically the CMOS structure for driving the word lines of memory cell array 26 under the control of signals supplied from the gate circuit array 25. It is characteristically so structured that the gate circuit array 26 supplies signals having the voltage levels which are equal to or substantially equal to the supply voltage of the CMOS devices of the driver circuit 27 so as to prevent the passing-through current from occurring in the CMOS devices.

In the circuit of FIG. 7, each of the gate circuits 25 includes an adjusted depletion type N-channel MOSFET 28 having its drain and source connected to the corresponding one of the output terminals of first decoder circuit 22 and the corresponding one of the input terminals of driver circuit 27, respectively, and its gate connected to the corresponding one of second signal lines 23-0 through 23-3 and an enhancement type P-channel MOSFET 29 having its drain connected to the corresponding one of the input terminals of driver circuit 27, its source connected to supply voltage (e.g., 5 volts) and its gate connected to the corresponding one of second signal lines 23-0 through 23-3. In the present specification, the "adjusted depletion type N-channel MOSFET" implies a depletion type N-channel MOSFET which has been adjusted to possess zero voltage as an apparent or effective threshold voltage by setting the threshold voltage at the negative side corresponding to the increased amount of threshold voltage due to the body effect.

In the embodiment shown in FIG. 7, the first decoder circuit 22 includes a first stage decoder circuit 30 which receives a 6-bit first address signal and a first control signal B as inputs and a second stage decoder circuit 31 which receives an input signal as supplied form the first stage decoder circuit 30 and supplies its output signal to one of sixty-four output terminals $Q_0$ through $Q_{63}$ selectively. The output terminals $Q_0$ through $Q_{63}$ are each connected to the corresponding first signal lines 21-0 through 21-63 each of which has fanout of four thereby forming 254 number of first signal lines. Second decoder circuit 24 receives a 2-bit second address signal and a second control signal CE and supplies a select signal as its output signal to selected one of second signal lines 23-0 though 23-3 which extend from its four output terminals.

Figure 8:
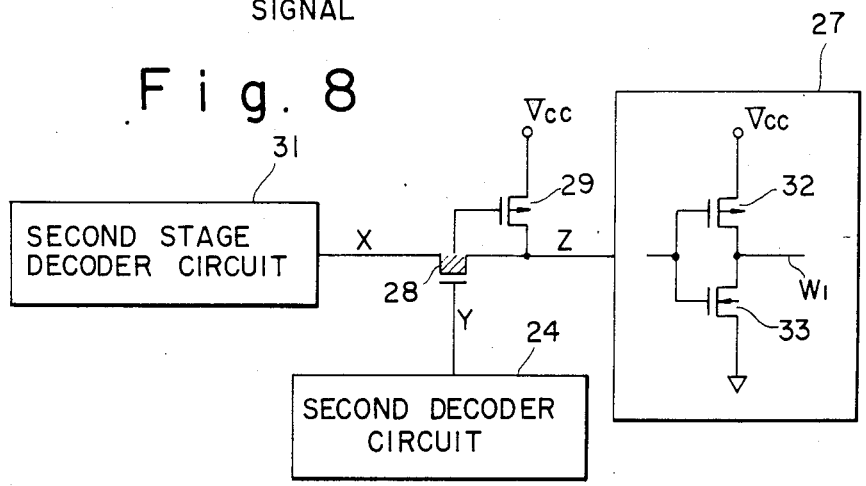
FIG. 8 is a circuit diagram schematically showing the gate and driver circuits forming part of the circuit shown in FIG. 7.

FIG. 8 shows a circuit diagram showing one of gate circuits 25 and one of CMOS devices contained in driver circuit 27 shown in FIG. 7. As shown in FIG. 8, when output signal X from second stage decoder circuit 31 is Hi (e.g., $V_{CC}$ level) and output signal Y from second decoder circuit 24 is also Hi, MOSFET 28 is turned on and MOSFET 29 is turned off so that input signal Z to the input terminal of driver circuit 27 is virtually the same in level as signal X. That is, signal Z is Hi and it is substantially at $V_{CC}$ level without a voltage drop due to the source-body effect because MOSFET 28 has been so adjusted as described above. On the other hand, when signal X is Hi and signal Y is Lo (or GND or 0 voltage level), MOSFET 28 is turned off and MOSFET 29 is turned on so that signal Z becomes $V_{CC}$ level. Furthermore, when signal X is Lo and signal Y is Hi, MOSFET 28 is turned on and MOSFET 29 is turned off so that signal Z becomes Lo, or GND level. Still further, when signals X and Y are both Lo, both of MOSFETs are turned on; however, since MOSFET 28 is in the high resistance condition due to its low gate voltage, signal Z becomes a level which is substantially close to $V_{CC}$ as determined by the ratio in on resistance between MOSFETs 28 and 29. The logic relations between signals X, Y and Z are tabulated as follows:

| X | Y | Z |
|---|---|---|
| H | H | $V_{CC}$ |
| H | L | $V_{CC}$ |
| L | H | GND |
| L | L | $\cong V_{CC}$ |

Driver circuit 27 includes a CMOS inverter comprised of a P-channel MOSFET 32 and an N-channel MOSFET 33, which has its input connected to receive output signal Z from gate circuit array 25 and its output connected to word line $W_1$ of memory cell array 26. In the case of a ROM, driver circuit 27 may be formed only by CMOS inverters, but in the case of a PROM or EPROM, a high voltage supply circuit for programming must be usually added.

From the above table, when signal X is Lo and signal Y is Hi, signal Z from gate circuit array 25 is at the GND level so that MOSFET 32 is turned on and MOSFET 33 is turned off thereby applying $V_{CC}$ to the word line $W_1$. On the other hand, in the event where signals X and Y are at the states other than the above-described combinations, signal Z is at the $V_{CC}$ level or a level which is very close to the $V_{CC}$ level so that MOSFET 32 is turned off and MOSFET 33 is turned on thereby causing the word line $W_1$ to become GND level. In this case, since MOSFET 32 is maintained substantially non-conductive, no passing-through current will occur through the CMOS inverter. If the structure of gate circuit array 25 is such that signal Z drops its voltage level significantly from the $V_{CC}$ level when both of signals X and Y are Hi, passing-through current will occur in the CMOS-structured driver circuit 27.

It is to be noted that the adjusted depletion type N-channel MOSFET 28 of the gate circuit array 25 may be substituted by a zero transistor. In the present specification, the "zero transistor" indicates a MOSFET whose threshold voltage is in the neighborhood of zero volt. It is true that the zero transistor will have a voltage drop due to the source-body effect as different from the adjusted depletion type N-channel MOSFET; however, it can still be used to attain an intended objective.

In the circuit of FIG. 7, a select state is indicated by the condition that input signal Z to driver circuit 27 is at GND level. Suppose that first signal line 21-0 is Lo with the other first signal lines 21-1 through 21-63 being Hi and second signal line 23-0 is Hi with the other second signal lines 23-1 through 23-3 being Lo, then the gate 25-1 is selected and a leakage current will flow from $V_{CC}$ to second stage decoder circuit 31 through MOSFETs 28 and 29 for the three gates 25-2 through 25-4. No leakage current will flow for the remaining gates 25-5 through 25-256 because the side of second stage decoder circuit 31 is at Hi level. As a result, leakage current will flow only through three signal lines among 256 lines so that the total leakage current may be made insignificant if the gate width of MOSFET 28 is narrowly set appropriately.

Figure 9:
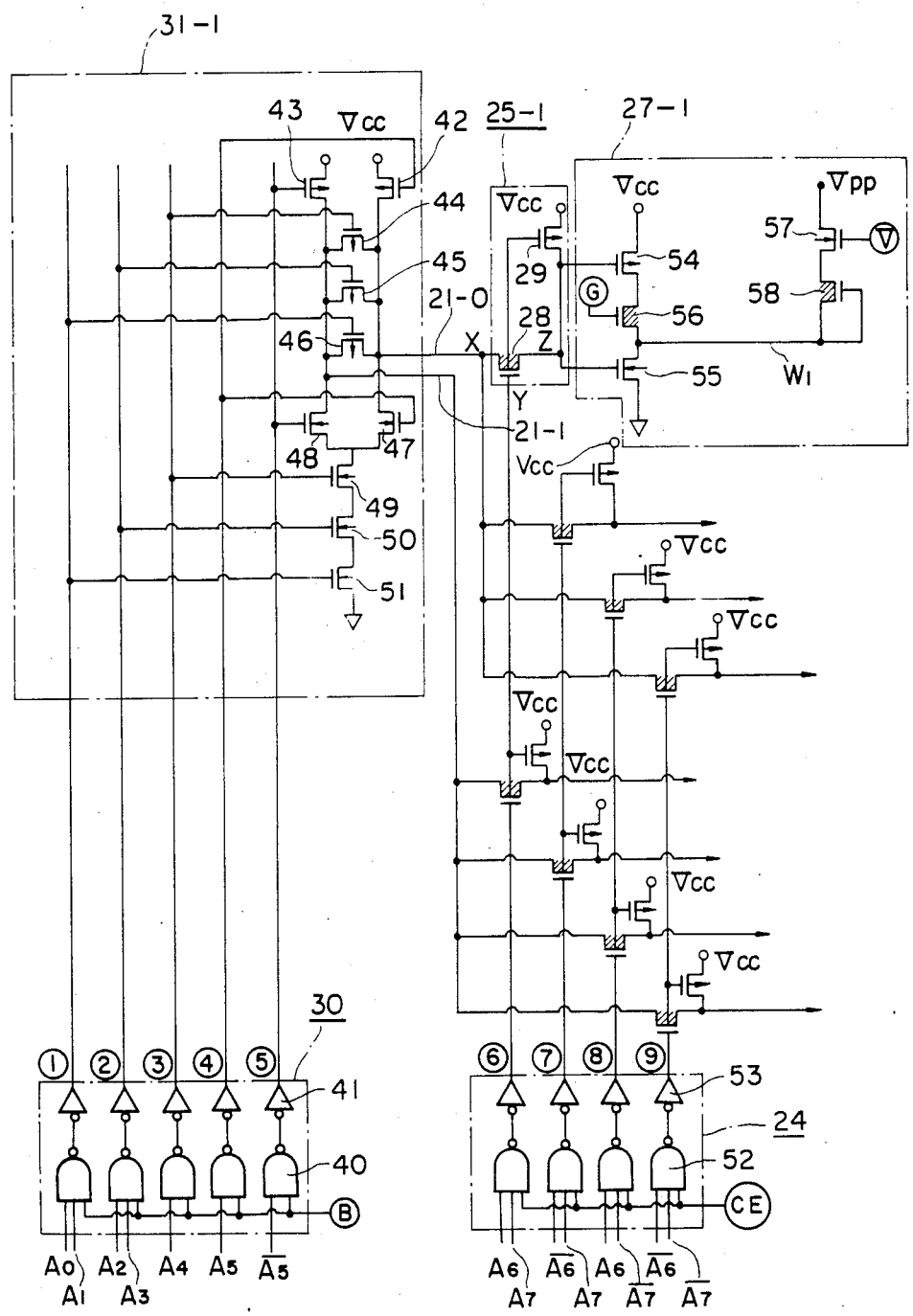
FIG. 9 is a circuit diagram partly showing the detailed structure of the circuit of FIG. 7 when applied to a particular embodiment such as a PROM or EPROM.

FIG. 9 shows the preferred embodiment showing the detailed structure of the peripheral circuit when it is applied to the case where a high level voltage, e.g., 20 volts or more, is applied to a word line for programming and a common supply voltage, e.g., 5 volts, is applied for reading as in the case of a PROM or EPROM. Described in comparison with the circuit of FIG. 7, first stage decoder circuit 30 in first decoder circuit 22 as an example to select one of 64 output terminals $Q_0$ through $Q_{63}$ in response to a 6-bit first address signal includes five NAND circuits 40 and five inverter circuits 41 each connected to the corresponding one of the NAND circuits 40. Second stage decoder circuit 31 in first decoder circuit 22 is formed by arranging 32 of second stage decoder circuit 31-1 having two output terminals. Second stage decoder circuit 31-1 includes five P-channel MOSFETs 42 through 46 and five N-channel MOSFETs 47 through 51. The numeral 25-1 indicates one of 256 gate circuits which have been described in detail above.

Second decoder circuit 24 which receives the second address signal includes four NAND circuits 52 and four inverter circuits 52. The numeral 27-1 indicates one of 256 driver circuits 27 arranged in the form of an array and it is so structured to drive a word line during read by a CMOS comprised of a P-channel MOSFET 54 and an N-channel MOSFET 55 which are connected in series between supply voltage $V_{CC}$ (5 volts) and ground voltage GND and to drive a word line during programming by a depletion type N-channel MOSFET 58 connected to a high voltage source terminal $V_{PP}$ (20 volts or more) and acting as a resistor and the N-channel MOSFET 55 connected to GND. A depletion type N-channel MOSFET 56 provided as interconnected between the MOSFETs 54 and 55 forming a CMOS structure and an N-channel MOSFET 57 provided as interconnected between the $V_{PP}$ terminal and the MOSFET 58 are transistors which switch between read and program modes in response to signals G and V supplied from the previously described voltage level converting circuit shown in FIG. 1. It is to be noted that MOSFET 58 may be connected to any position of a word line.

In the illustrated example, in order to set driver circuit 27-1 in the driving state by gate circuit 25-1, the first address signal $A_0$ through $A_5$ must be set as "111111" and the first control signal B must be set as "1" with the second address signal of $A_6$ and $A_7$ and the second control signal CE being set as "11" and "1", respectively. As a result, the output signals 1 through 4 from the first stage decoder circuit 30 are Hi and the output signal 5 is Lo so that, in the second stage decoder circuit 31-1, P-channel MOSFET 43 and N-channel MOSFETs 47, 49, 50 and 51 are rendered conductive and P-channel MOSFETs 42, 44, 45 and 46 and N-channel MOSFET 48 are rendered non-conductive. Thus first signal line 21-0 becomes Lo and the remaining first signal lines are maintained at Hi. In second decoder circuit 24, output signal 6 is Hi and output signals 7 through 9 are Lo, so that only signal Z of gate circuit 25-1 becomes Lo to cause driver circuit 27-1 activated to be in the driving state with all of the other driver circuits maintained deactivated.

In driver circuit 27-1, during programming, MOSFET 57 is on and MOSFET 56 is off because signal V is at a high voltage level ($V_{PP}$) and signal G is at a low level as supplied from the voltage level converting circuit of FIG. 1. Under the condition, if input signal Z to driver circuit 27-1 is Lo, MOSFET 55 is turned off, and, furthermore, MOSFET 56 is also turned off with its source, drain and gate at $V_{PP}$, Hi and Lo, respectively. Accordingly, a high voltage is applied to word line $W_1$ and the memory cell located at the interconnection with a selected bit line ( not shown ) is programmed. On the other hand, if input signal Z is Hi, MOSFET 55 is turned on so that the voltage of word line $W_1$ will be low and sufficiently close to the GND level owing to a voltage division between MOSFETs 58 and 55 whereby no programming takes place.

Figure 16:
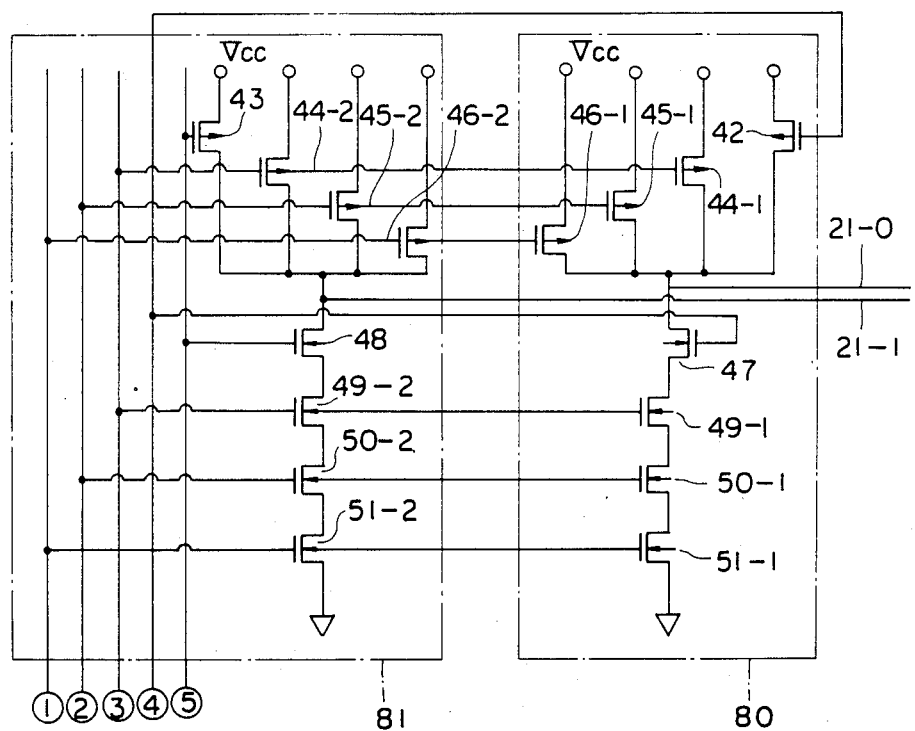
FIG. 16 is a circuit diagram showing an alternative structure of the second stage decoder circuit shown in FIG. 9.

During read, signals V and G supplied from the voltage level converting circuit of FIG. 1 are Lo and Hi, respectively, as opposite to the above-described case of programming mode, so that MOSFET 57 is turned off and MOSFET 56 is turned on thereby establishing a CMOS inverter formed by MOSFETs 54 and 55. Under the condition, if input signal Z is Lo, MOSFET 54 is turned on and MOSFET 55 is turned off so that the $V_{CC}$ level voltage is applied to word line $W_1$ and the contents of a memory cell located at the interconnection with a selected bit line are read out. On the other hand, if input signal Z is Hi, MOSFET 54 is turned off and MOSFET 55 is turned on so that the voltage of word line $W_1$ becomes GND level whereby no read out takes place. In the illustrated example, when input signal Z to driver circuit 27-1 is Hi, this Hi level is equal to $V_{CC}$ or almost equal to $V_{CC}$ with very little voltage drop, and, thus, no passing-through current will appear in the CMOS device comprised of MOSFETs 54 and 55. Moreover, since second stage decoder circuit 31 of this embodiment is so structured as shown in FIG. 9, it is apparent that it is simpler in structure as compared with the functionally equivalent circuit formed by combining two prior art NAND circuits as shown in FIG. 16. Consequently, when formed as an intergrated circuit, the area occupied by the decoder may be reduced thereby allowing to produce a high density memory device.

Figure 10:
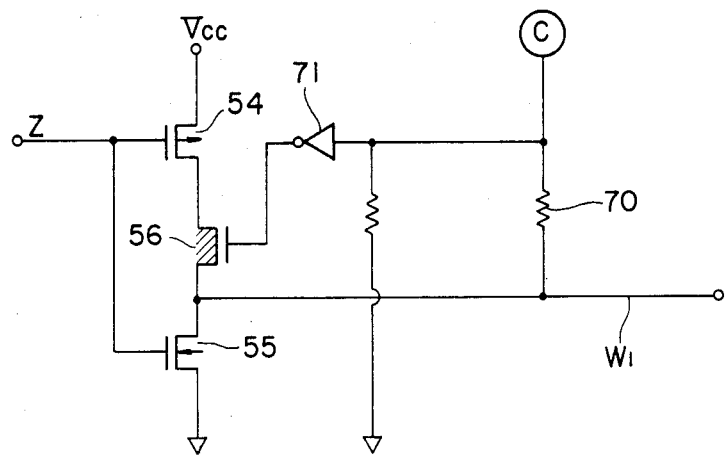
FIGS. 10 through 15 are circuit diagrams showing several examples of the driver circuit forming a part of the peripheral circuit of FIG. 7.

Various modifications of driver circuit 27-1 which may be advantageously used in the illustrated embodiment of FIG. 9 are shown in FIGS. 10 through 15. In the embodiment of FIG. 10, a resistor 70 is provided in place of MOSFET 58 which is provided in driver circuit 27-1 of FIG. 9. During programming, the $V_{PP}$ level voltage is applied to terminal C by a circuit which is not shown, and, during read, terminal C is set floating. Such a terminal C may be easily formed by a diode or a transistor as indicated by B in FIGS. 11 and 12. It is to be noted that MOSFET 55 is so structured to have the on resistance which is sufficiently smaller than the resistance of resistor 70. In this driver circuit, during programming, the gate of MOSFET 56 becomes Lo through inverter 71. When input signal Z becomes Lo to have the driving state established, MOSFET 55 is turned off and MOSFET 54 is turned on so that MOSFET 56 is rendered non-conductive thereby supplying a high level voltage to word line $W_1$. During the non-driving state in which input signal Z stays Hi, MOSFET 54 is off and MOSFET 55 is on, and, therefore, word line $W_1$ is at GND level. During read, the gate of MOSFET 56 becomes Hi thereby causing MOSFET to be turned on, and there is established a CMOS inverter including MOSFETs 54 and 55, and word line $W_1$ is driven by input signal Z as in the case of FIG. 9.

Figure 11:
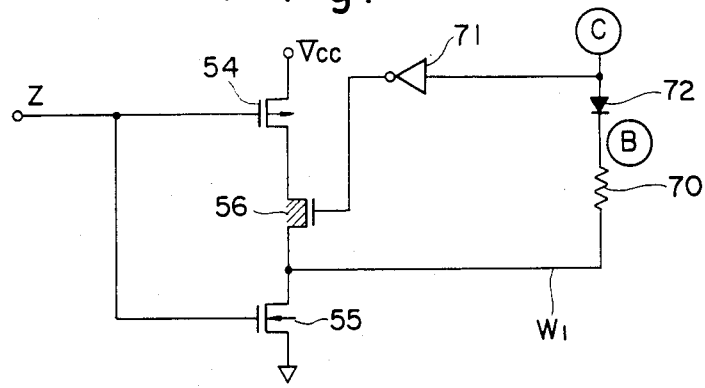
Figure 12:
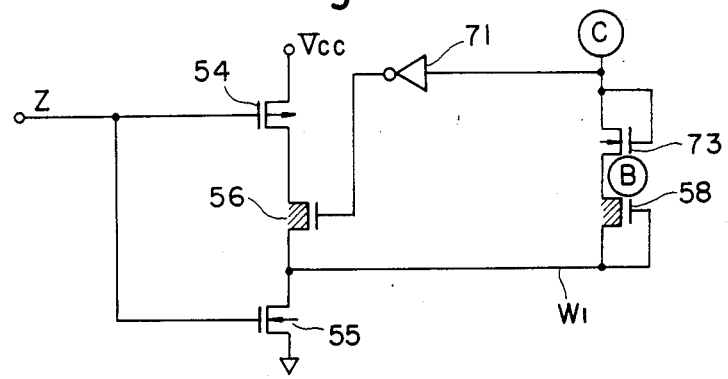

FIG. 11 shows another embodiment which includes a diode 72 as connected between terminal C and resistor 70. Provision of such a diode 72 eliminates the need for setting terminal C to be floated during read. The reverse current from word line $W_1$ to terminal C can be prevented from occurring simply by lowering the voltage applied to terminal C. The other function of this circuit is similar to that of FIG. 10. FIG. 12 shows a further embodiment in which the use is made of the on resistance of depletion type N-channel MOSFET 58 instead of resistor 70 with the substitution of diode 72 by a diode-connected N-channel MOSFET 73. This circuit is functionally the same as that of FIG. 11. It is to be noted that MOSFET 73 may be replaced by a zero transistor having the threshold voltage in the neighborhood of 0 volt, in which case, the voltage drop due to the body effect may be decreased.

Figure 13:
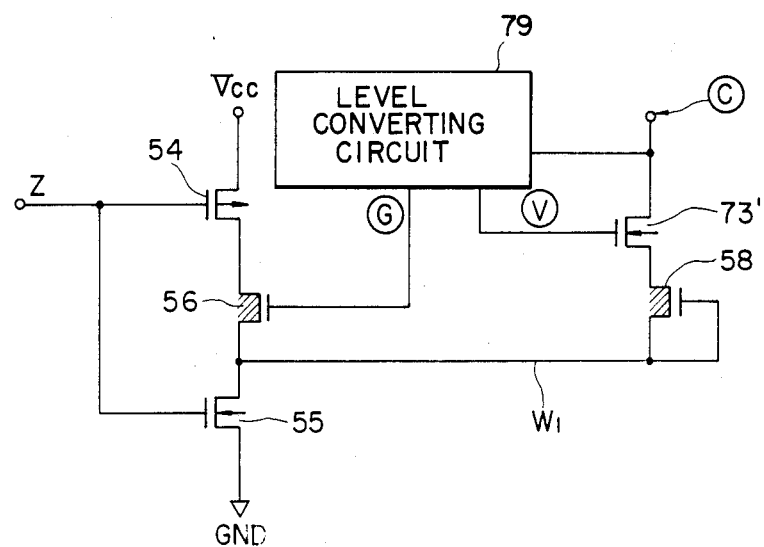

FIG. 13 shows a still further embodiment of driver circuit 27-1, and this embodiment is basically similar in structure to the circuit of FIG. 12. In the circuit of FIG. 13, there is provided the voltage level converting circuit 79 which may have the structure as previously described with reference to FIG. 1. The voltage level converting circuit 79 is connected to terminal C and it is connected to supply signal V to the gate of MOSFET 73' and to supply signal G to the gate of MOSFET 56. As described previously, the voltage level converting circuit 79 is so structured to set signal G to MOSFET 56 low and to supply the voltage applied to terminal C if the voltage applied to terminal C is equal to or higher than $V_{CC}$ and to set signal G to MOSFET 56 high and to set signal V to MOSFET 73' low if the voltage applied to terminal C becomes lower than $V_{CC}$. In other words, in the circuit of FIG. 13, in the case when the voltage applied to terminal C is sufficiently high, signal V is high thereby causing MOSFET 73' turned on and signal G is low thereby a CMOS inverter formed by MOSFETs 55 and 58 is established. On the other hand, when the voltage applied to terminal C becomes lower than $V_{CC}$, signal G becomes Hi to have MOSFET 56 turned on and signal V is Lo to have MOSFET 73' turned off so that another CMOS inverter formed by MOSFETs 54 and 55 is established to be active.

Figure 14:
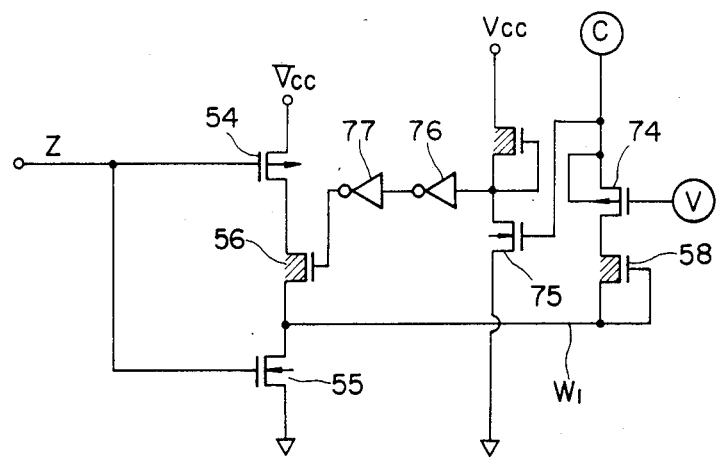

FIG. 14 shows a still further embodiment of driver circuit 27-1 which is constructed by having MOSFET 57 of FIG. 9 replaced by P-channel MOSFET 74. A gate signal $\overline{V}$ applied to the gate of P-channel MOSFET 74 is opposite in phase with the gate signal V of FIG. 9, and it may be obtained by simply inverting the output signal from the voltage level converting circuit of FIG. 1. During programming, a voltage at $V_{PP}$ level is applied to terminal C. Since the inverted signal $\overline{V}$ becomes GND level, MOSFET 74 is rendered conductive. Moreover, since an N-channel MOSFET 75 is turned on, the gate signal applied to the gate of MOSFET 56 through two serially connected inverters 76 and 77 becomes Lo, and, thus, the programming operation similar to that described with reference to FIG. 9 follows. During read, the voltage applied to terminal C is set at GND level. Since the inverted signal $\overline{V}$ becomes $V_{PP}$ level or Hi, MOSFET 74 is turned off thereby allowing to prevent the reverse current from flowing from word line $W_1$ to terminal C. In addition, since MOSFET 75 is turned off, the gate signal applied to MOSFET 56 via inverters 76 and 77 becomes Hi, and, thus, the read operation similar to that described with reference to FIG. 9 takes place.

Figure 15:
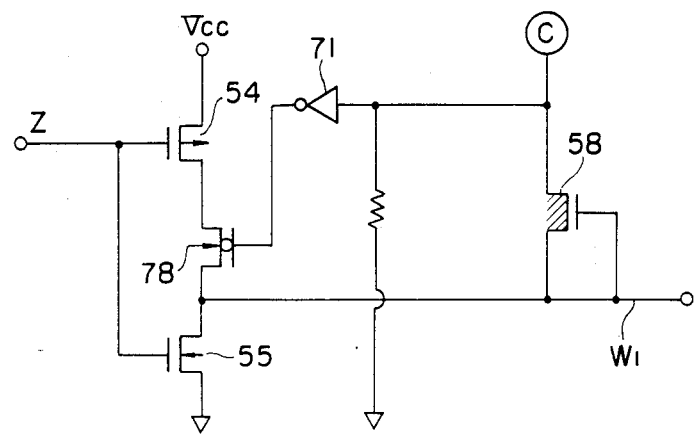

FIG. 15 shows a still further embodiment of driver circuit 27-1 which is constructed by having depletion type N-channel MOSFET 56 replaced by a zero transistor 78 and resistor 70 by the on resistance of depletion type N-channel MOSFET 58. This circuit is functionally equivalent to the circuit of FIG. 10. The circuit of FIG., 15 may be so modified to have a voltage at the $V_{CC}$ level always applied to the gate of zero transistor 78 by removing the circuit including inverter 71 and resistor provided between the gate of zero transistor 78 and terminal C. When terminal C is at $V_{PP}$ level, the zero transistor 78 is turned off so that the operation similar to the circuit of FIG. 10 follows. Moreover, zero transistor 78 of FIG. 15 may be replaced by an enhancement type N-channel MOSFET, if desired. In this case, however, there will be produced a relatively large voltage drop in the voltage applied to a word line during read operation.

FIG. 16 shows an alternative structure of second stage decoder circuit 31-1 of FIG. 9. As shown, the structure of FIG. 16 includes two 4-input NANDs 80 and 81 and it carries out the function exactly the same as that of FIG. 9. In the circuit of FIG. 16, however, each of NAND circuits 80 and 81 requires four P-channel MOSFETs and four N-channel MOSFETs, and, thus, the total of eight P-channel MOSFETs and eight N-channel MOSFETs is needed. When compared with the second stage decoder circuit 31-1 of FIG. 9 which is comprised of five P-channel MOSFETs and five N-channel MOSFETs, the structure of FIG. 9 is more advantageous when constructed in the form of an integrated circuit. The reason why the number of transistors is reduced in the circuit of FIG. 9 is that MOSFETs 44-1 and 44-2 of FIG. 16 are combined into a single MOSFET 44 of FIG. 9 and the similar idea is applied with regard to other MOSFETs such as 45-1, 45-2, 46-1, 46-2, 49-1, 49-2, 50-1, 50-2, 51-1 and 51-2.

Figure 17:
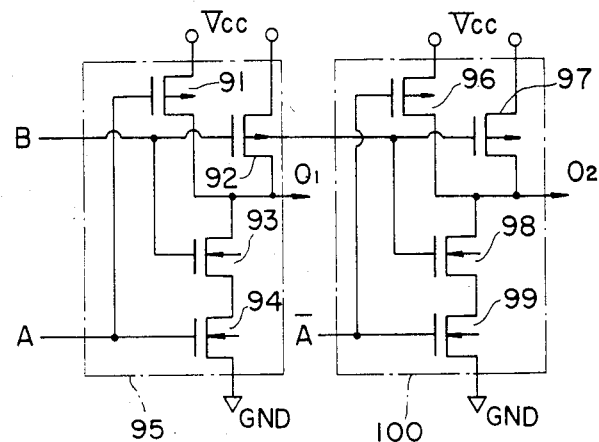
FIG. 17 is a circuit diagram showing a prior art 2-input, 2-output NAND circuit constructed by combining two NAND circuits.
Figure 18:
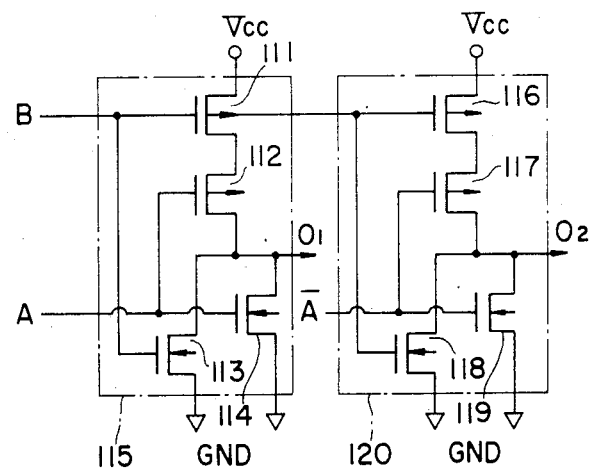
FIG. 18 is a circuit diagram showing a prior art 2-input, 2-output NOR circuit constructed by combining two NOR circuits.

FIG. 17 shows a 2-output NAND circuit formed by using the conventional CMOS NAND circuits. That is, as shown in FIG. 17, it includes a first NAND circuit 95 comprised of a pair of parallely connected P-channel MOSFETs 91 and 92 and a pair of serially connected N-channel MOSFETs 93 and 94 and a second NAND circuit 100 comprised similarly of a pair of parallely connected P-channel MOSFETs 96 and 97 and a pair of serially connected N-channel MOSFETs 98 and 99. With input signals A and B applied to the first NAND circuit 95 and the signal B and the inverted signal $\overline{A}$ applied to the second NAND circuit 100, the first NAND circuit 95 supplies $\overline{A*B}$ as its output and the second NAND circuit 100 supplies $\overline{\overline{A}*B}$ as its output. On the other hand, FIG. 8 shows a 2-output NOR circuit which is formed by using two conventional CMOS type NOR circuits. For example, as shown in FIG. 18, such a 2-output NOR circuit may include a first NOR circuit 115 comprised of a pair of P-channel MOSFETs 111 and 112 and a pair of N-channel MOSFETs 113 and 114 and a second NOR circuit 120 comprised of a pair of P-channel MOSFETs 116 and 117 and a pair of N-channel MOSFETs 118 and 119. With a common signal B applied to one input of each of NOR circuits 115 and 120 and signals A and $\overline{A}$ applied to the other inputs of NOR circuits 115 and 120, respectively, the first NOR circuit 115 supplies $\overline{A+B}$ as its output and the second NOR circuit 120 supplies $\overline{\overline{A}+B}$ as its output. However, the circuits of FIGS. 17 and 18 are constructed by simply adding another single output logic circuit to make a multiple output logic circuit, the number of MOSFETs used is rather large so that it is disadvantageous areawise when constructed in the form of an intergrated circuit and also in power dissipation.

Figure 19:
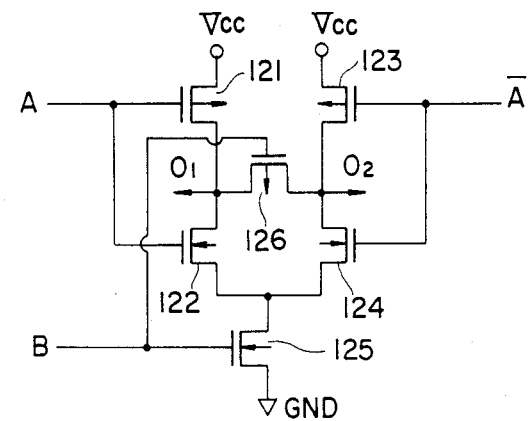
FIG. 19 is a circuit diagram showing a novel 2-input, 2-output NAND circuit.

FIG. 19 shows a novel 2-input, 2-output NAND circuit which is functionally equivalent to the circuit of FIG. 17. In the circuit of FIG. 19, a P-channel MOSFET 121 and an N-channel MOSFET 122 are connected each other to establish a CMOS structure and another CMOS structure is established by interconnected P-channel MOSFET 123 and N-channel MOSFET 124. The source of each of P-channel MOSFETs 121 and 123 is connected to $V_{CC}$ terminal (e.g., 5 volts) as a high voltage voltage source, and the sources of N-channel MOSFETs 122 and 124 are commonly connected. An N-channel MOSFET 125 is provided with its drain and source connected to the common source connection between MOSFETs 122 and 124 and GND, respectively. Further, another P-channel MOSFET 126 is provided with its source and drain connected to the common drain connections of each of the two CMOSs, respectively. The gate of MOSFET 121 and the gate of MOSFET 122 are commonly connected to which a first input signal A is applied; on the other hand, the gate of MOSFET 123 and the gate of MOSFET 124 are also commonly connected to which an inverted signal $\overline{A}$ of signal A is applied. Furthermore, the gate of MOSFET 126 is connected to the gate of MOSFET 125 to which a second signal B is applied. The drain junction $O_1$ between MOSFETs 121 and 122 defines a first output point and the other drain junction $O_2$ between MOSFETs 123 and 124 defines a second output point.

If the input signal A is at $V_{CC}$ level and the other input signal B is at GND level, since the inverted input signal $\overline{A}$ is Lo, MOSFETs 122, 123 and 125 are all turned on and MOSFETs 121, 124 and 126 are all turned off, so that the first output point $O_1$ supplies a high level output signal as it is connected to $V_{CC}$ terminal through MOSFETs 123 and 126 and at the same time the second output point $O_2$ also supplies a high level signal as it is connected to $V_{CC}$ terminal via MOSFET 123. On the other hand, in the case where input signal A is Hi and input signal B is also Hi, MOSFETs 122, 125 and 123 are turned on; whereas, MOSFETs 121, 126 and 124 are turned off. Accordingly, the first output point $O_1$ supplies Lo since it is connected to GND via MOSFETs 125 and 126, and the second output point $O_2$ supplies Hi since it is connected to $V_{CC}$ through MOSFET 123.

In the case where input signal A is Lo and input signal B is also Lo, MOSFETs 121, 126 and 124 are turned on and MOSFETs 122, 125 and 123 are turned off. Consequently, the first output point $O_1$ supplies Hi since it is connected to $V_{CC}$ through MOSFET 121 and the second output point $O_2$ also supplies Hi since it is connected to $V_{CC}$ through MOSFETs 121 and 126.

Finally, in the case where input signal A is Lo and input signal B is Hi, MOSFETs 121, 124 and 125 are turned on and MOSFETs 122, 123 and 126 are turned off. Therefore, the first output point supplies Hi since it is connected to $V_{CC}$ via MOSFET 121 and the second output point $O_2$ supplies Lo since it is connected to GND via MOSFETs 125 and 124.

The above-described operation of the logic circuit of FIG. 19 may be tabulated as below.

| A | $\overline{A}$ | B | $O_1$ | $O_2$ |
|---|---|---|---|---|
| H | L | L | H | H |
| H | L | H | L | H |
| L | H | L | H | H |
| L | H | H | H | L |

As a result, at the first and second output points $O_1$ and $O_2$ of the circuit of FIG. 19, the following relations hold.

$$O_1 = \overline{A*B}$$

$$O_2 = \overline{\overline{A}*B}$$

In order to carry out the identical function, the prior art circuit of FIG. 17 uses four P-channel MOSFETs and four N-channel MOSFETs; on the other hand, the novel structure of FIG. 19 uses three P-channel MOSFETs and three N-channel MOSFETs.

Figure 20:
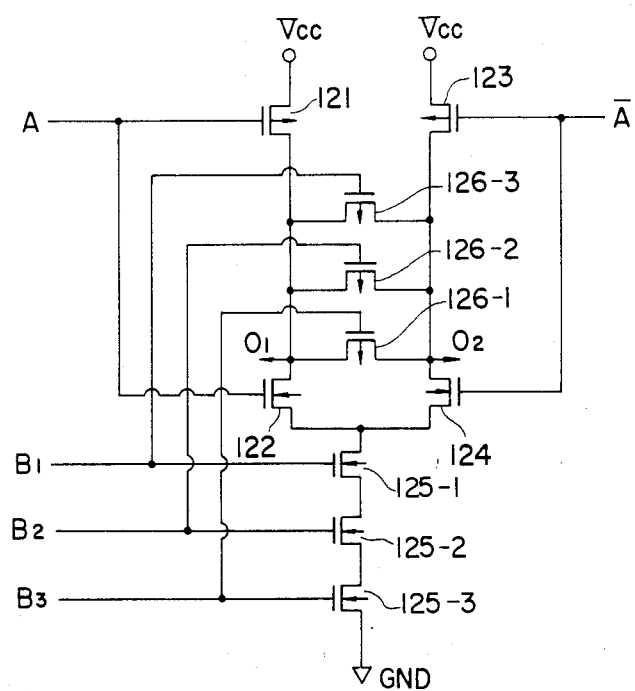
FIG. 20 is a circuit diagram showing a novel 4-input, 2-output NAND circuit.

FIG. 20 illustrates a 4-input, 2-output NAND circuit constructed on the basis of the above-described principle. The circuit of FIG. 20 differs from the circuit of FIG. 19 in structure in that, in the circuit of FIG. 20, three N-channel MOSFETs 125-1, 125-2 and 125-3 are connected in series between the common source connection between N-channel MOSFETs 122 and 124 and GND level, and three P-channel MOSFETs 126-1, 126-2 and 126-3 are connected in parallel between the common drain connections of the two CMOSs. Three input signals $B_1$, $B_2$ and $B_3$ are supplied to the gates of the paired N-channel and P-channel MOSFETs 125-1 and 126-3; 125-2 and 126-2; and 125-3 and 126-1. For example, in the case where input signals A, $B_1$, $B_2$ and $B_3$ are L, H, L and H, respectively, MOSFETs 121, 126-2, 125-1 and 125-3 are turned on and the other MOSFETs are turned off. Thus, the first output point $O_1$ supplies Hi since it is connected to $V_{CC}$ via MOSFET 121; whereas, the second output point $O_2$ supplies Hi since it is connected to $V_{CC}$ via MOSFETs 121 and 126-2. Similarly, the output conditions for other combinations of input conditions may be easily established, and the result is shown as tabulated below.

| A | $B_1$ | $B_2$ | $B_3$ | $O_1$ | $O_2$ |
|---|---|---|---|---|---|
| L | L | L | L | H | H |
| L | L | L | H | H | H |
| L | L | H | L | H | H |
| L | L | H | H | H | H |
| L | H | L | L | H | H |
| L | H | L | H | H | H |
| L | H | H | L | H | H |
| L | H | H | H | H | L |
| H | L | L | L | H | H |
| H | L | L | H | H | H |
| H | L | H | L | H | H |
| H | L | H | H | H | H |
| H | H | L | L | H | H |
| H | H | L | H | H | H |
| H | H | H | L | H | H |

-continued

| A | B₁ | B₂ | B₃ | O₁ | O₂ |
|---|----|----|----|----|----|
| H | H | H | H | L | H |

As a result, the following relations between the input and output conditions hold for the circuit of FIG. 20.

$$O_1 = \overline{A \cdot B_1 \cdot B_2 \cdot B_3}$$

$$O_2 = \overline{A \cdot B_1 \cdot B_2 \cdot B_3}$$

The above relations verify that the circuit of FIG. 20 is a 4-input, 2-output NAND circuit.

Figure 21:
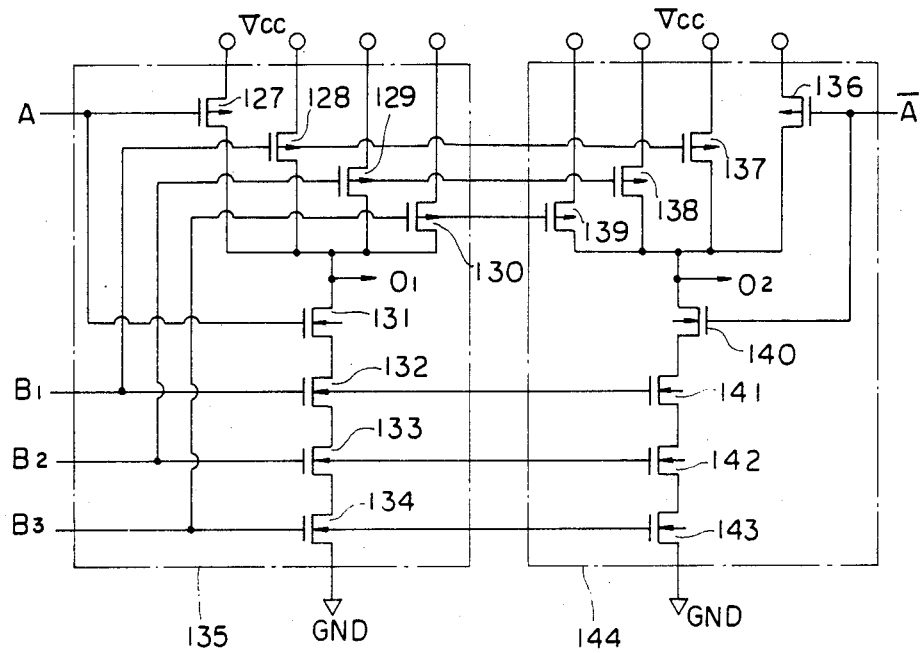
FIG. 21 is a circuit diagram showing a prior art 4-input, 2-output NAND circuit constructed by combining two NAND circuits.

In a 2-output NAND circuit, in the event where the number of inputs is further increased, a pair of N-channel and P-channel MOSFETs may be added for each of increased input signals, the N-channel MOSFET being connected in series between the common source connection between MOSFETs 122 and 124 and GND and the P-channel MOSFET being connected in parallel between the two common drain connections of the pair of CMOS structures. The circuit of FIG. 20 is comprised of ten MOSFETs in total, i.e., five P-channel MOSFETs 121, 123, 126-1, 126-2 and 126-3 and five N-channel MOSFETs 122, 124, 125-1, 125-2 and 125-3. In comparison therewith, if a circuit having the same function as that of FIG. 20 is to be constructed in accordance with the prior art technique, it will result in the structure as shown in FIG. 21, which is comprised of a first 4-input NAND circuit 135 including four P-channel MOSFETs 127 through 130 and four N-channel MOSFETs 131 through 134 and a second 4-input NAND circuit 144 including four P-channel MOSFETs 136 through 139 and four N-channel MOSFEts 140 through 143. In the circuit of FIG. 21, the total number of MOSFETs used amounts to 16.

Figure 22:
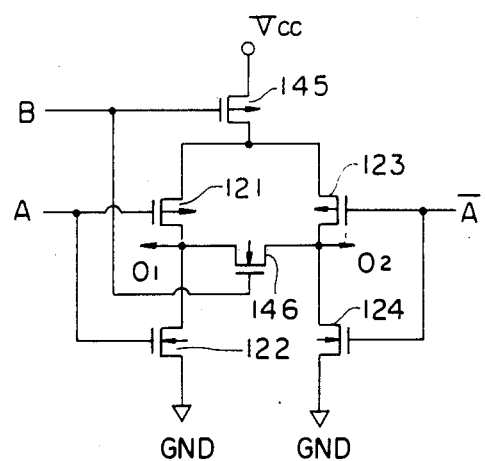
FIG. 22 is a circuit diagram showing a novel 2-input, 2-output NOR circuit.

FIG. 22 shows a novel 2-input, 2-output NOR circuit which is equivalent in function to the circuit shown in FIG. 18. As shown in FIG. 22, a CMOS structure is formed by a P-channel MOSFET 121 and an N-channel MOSFET 122 and another CMOS structure is formed by a P-channel MOSFET 123 and an N-channel MOSFET 124. The MOSFETs 121 and 123 have their sources commonly connected and a P-channel MOSFET 145 is connected between the common source connection and V<sub>CC</sub>; on the other hand, an N-channel MOSFET 146 is provided as connected between the common drain connections of the two CMOS structures. The gate of MOSFET 121 is connected to the gate of MOSFET 122 and a first input signal A is applied to these commonly connected gates; whereas, the gate of MOSFET 123 is connected to the gate of MOSFET 124 and an input signal which is an inverted signal of signal A is applied to these latter commonly connected gates. Besides, the gate of P-channel MOSFET 145 is connected to the gate of MOSFET 146, and a second signal B is applied to the commonly connected gates of these MOSFETs 145 and 146. The common drain connection of each of the CMOS structures define first and second output points O₁ and O₂.

Now, if input signal A is Lo and input signal B is Lo, then MOSFETs 121, 145 and 124 are on and MOSFETs 122, 146 and 123 are off, so that first output point O₁ supplies Hi since it is connected to V<sub>CC</sub> via MOSFETs 145 and 121; whereas, second output point O₂ supplies Lo since it is connected to GND via MOSFET 124.

Similarly, the relations between input and output conditions may be easily derived as shown tabulated below.

| A | B | O₁ | O₂ |
|---|---|----|----|
| L | L | H | L |
| L | H | L | L |
| H | L | L | H |
| H | H | L | L |

As a result, the relations between input and output conditions for the circuit of FIG. 22 may be expressed as in the following manner.

$$O_1 = \overline{A + B}$$

$$O_2 = \overline{\overline{A} + B}$$

This verifies that the circuit of FIG. 22 has the identical function with the circuit of FIG. 18. In contrast to the circuit of FIG. 18 in which the total number of MOSFETs used is eight, the total number of MOSFETs used in the novel circuit of FIG. 22 is six. It is thus clear that the required number of MOSFETs may be reduced not only in NAND circuits but also in NOR circuits when the above-described novel principle is applied to construct logic circuits. If the number of input signals increases in the 2-output NOR circuit, it is only necessary to add a pair of P-channel and N-channel MOSFETs for each of the increased number of input signals, the added P-channel MOSFET being connected in series with the MOSFET 121 between the common source connection between MOSFETs 121 and 123 and V<sub>CC</sub> and the added N-channel MOSFET being connected in parallel with MOSFET 146 between the common drain connections of the pair of CMOS structures. And, the gates of the newly added pair of MOSFETs are commonly connected for receiving the additional input signal.

As compared with a 2-output logic circuit which is constructed by combining two prior art NAND or NOR circuits, the reduced number of MOSFETs required for constructing the equivalent 2-output logic circuit on the basis of the present novel principle may be expressed by 2×(n−1), denoting the number of input signals by n. This relation holds whether or not it is a NAND or NOR circuit.

Figure 23:
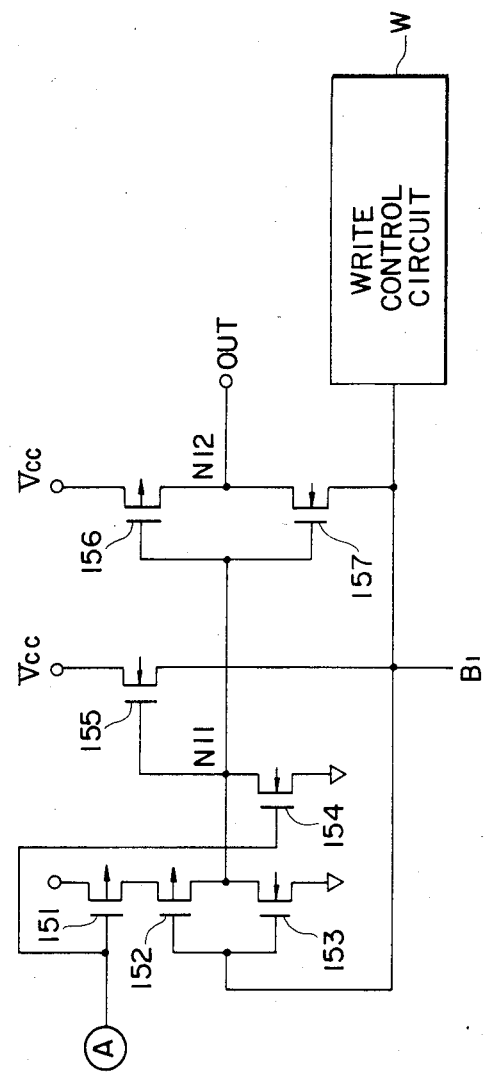
FIG. 23 is a circuit diagram showing a novel sense circuit which is extremely low in power dissipation and particularly suited for use in a semiconductor memory device such as ROM, PROM and EPROM.

FIG. 23 shows a novel sense circuit for use in a semiconductor memory device which is extremely low in power dissipation. As shown in FIG. 23, the sense circuit includes a P-channel MOSFET 152 and an N-channel MOSFET 153 which are connected in series to form an inverter and which have their gates connected to the corresponding bit line B₁ of the associated semiconductor memory cell array. The sense circuit also includes a P-channel MOSFET 151 which is connected in series to the CMOS inverter of MOSFETs 152 and 153 and which is held off during the stand-by state. The gate of MOSFET 151 receives a signal A which becomes Hi during the stand-by state. Also provided in the sense circuit are P-channel MOSFET 156 and N-channel MOSFET 157 which are connected each other to form an amplifying inverter and which have their gates connected to a node N₁₁ which, in turn, is the interconnection between the source and drain of serially connected MOSFETs 152 and 153. On the other hand, a node N₁₂, which is the interconnection between the source and drain of MOSFETs 156 and 157, defines an output point of the sense circuit for supplying an output signal of the sense circuit. In addition, the source of MOSFET 157 is connected to the corresponding bit line $B_1$ which extends into the associated memory cell array (not shown).

The sense circuit of FIG. 23 also includes an N-channel MOSFET 155, which is used to reduce the access time for high-speed operation. MOSFET 155 has its gate connected to node $N_{11}$ and its source connected to the corresponding bit line. An N-channel MOSFET 154 is connected between node $N_{11}$ and the substrate and the gate of MOSFET 154 is connected to receive stand-by signal A. There is also provided a write control circuit W as shown. As may have already been noticed, MOSFETs 151 through 157 are appropriately connected to form CMOS structures of P-channel and N-channel MOSFETs.

In the sense circuit of FIG. 23, during the stand-by state, stand-by signal A is Hi so that MOSFET 151 is turned off and MOSFET 154 is turned on. Accordingly, irrespective of the voltage condition of bit line $B_1$, no passing-through current will flow through any of MOSFETs 151, 152 and 153. Moreover, since node $N_{11}$ becomes Lo, MOSFET 157 is turned off and no current will pass through MOSFETs 156, 157 and memory transistors (not shown). On the other hand, during access, stand-by signal A is set Lo, and, thus, MOSFET 151 is turned on and MOSFET 154 is turned off. Then, depending upon whether bit line $B_1$ is Lo or Hi, MOSFETs 152 and 153 are turned on or off and the voltage level of node $N_{11}$ becomes Lo or Hi. This signal is then amplified by the CMOS inverter comprised of MOSFETs 156 and 157 and the sense output signal indicating the memory state of the accessed cell, whether Hi or Lo, is supplied to output terminal OUT.

MOSFET 155 is turned on or off depending upon the voltage level at node $N_{11}$ thereby restraining the fluctuations of the voltage at the bit line and reducing the access time. During programming, stand-by signal A becomes Hi and thus MOSFETs 151, 155 and 157 are turned off, whereby bit line $B_1$ is disconnected from supply voltage $V_{CC}$ and only write control circuit W is left connected to bit line $B_1$. As described above, during programming, since MOSFET 157 is turned off, no high voltage is applied to the drain of MOSFET 156. Consequently, the possibility of causing latch-ups is effectively removed.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A voltage level converting circuit for converting the voltage level of an input signal to a desired level, comprising:

an input terminal to which an input signal may be applied;

voltage level detecting means connected to said input terminal for detecting the voltage level of said input signal and supplying a high level output signal when said input signal has been detected to be equal to or higher than a predetermined voltage level or a low level output signal when said input signal has been detected to be lower than said predetermined voltage level, said voltage level detecting means including a first P-channel MOSFET and a first N-channel MOSFET which are connected in series between said input terminal and a first reference voltage and which have their gates connected to a second reference voltage, said voltage level detecting means further including a depletion type N-channel MOSFET which is connected in series between said input terminal and said series connected first P-channel and N-channel MOSFETs and which has its gate connected to said second reference voltage;

inverting means having an input and an output, said input of said inverting means being connected to the junction between said first P-channel and first N-channel MOSFETs of said voltage level detecting means for inverting the output signal supplied from said voltage level detecting means; and a CMOS device including a pair of second P-channel and second N-channel MOSFETs which are connected in series between said input terminal and said first reference voltage, the gate of each of said second P-channel and second N-channel MOSFETs being connected to said output of said inverting means and the junction between said second P-channel and second N-channel MOSFETs being connected to an output terminal of said circuit.

2. A circuit of claim 1 wherein said second reference voltage is equal to said predetermined voltage level.

3. A circuit of claim 2 wherein said first reference voltage is ground voltage and said second reference voltage is a supply voltage.

4. A voltage level converting circuit for converting the voltage level of an input signal to a desired level, comprising:

an input terminal to which an input signal may be applied;

voltage level detecting means connected to said input terminal for detecting the voltage level of said input signal and supplying a high level output signal when said input signal has been detected to be equal to or higher than a predetermined voltage level or a low level output signal when said input signal has been detected to be lower than said predetermined voltage level, said voltage level detecting means including a first P-channel MOSFET and a first N-channel MOSFET which are connected in series between said input terminal and a first reference voltage and which have their gates connected to a second reference voltage, said voltage level detecting means further including at least one enhancement type N-channel MOSFET which is connected in series between said input terminal and said series connected first P-channel and N-channel MOSFETs and which has its gate connected to its source/drain region located closer to said input terminal;

inverting means having an input and an output, said input of said inverting means being connected to the junction between said first P-channel and first N-channel MOSFETs of said voltage level detecting means for inverting the output signal supplied from said voltage level detecting means; and a CMOS device including a pair of second P-channel and second N-channel MOSFETs which are connected in series between said input terminal and said first reference voltage, the gate of each of said second P-channel and second N-channel MOS- FETs being connected to said output of said inverting means and the junction between said second P-channel and second N-channel MOSFETs being connected to an output terminal of said circuit.

5. A circuit of claim 4 wherein said second reference voltage is equal to said predetermined voltage level.

6. A circuit of claim 5 wherein said first reference voltage is ground voltage and said second reference voltage is a supply voltage.

7. A voltage level detecting circuit for detecting the voltage level of an input signal supplied thereto for supplying a high level output signal as its output when said input signal has been detected to be equal to or higher than a predetermined voltage level or a low level output signal when said input signal has been detected to be lower than said predetermined voltage level, comprising:

an input terminal for receiving said input signal;

a depletion type MOSFET having a first source/drain region connected to said input terminal, a second source/drain region, and a first gate;

a first enhancement type MOSFET having a third source/drain region connected to said second source/drain region of said depletion type MOSFET, a fourth source/drain region, and a second gate; and a second enhancement type MOSFET having a fifth source/drain region connected to said fourth source/drain region and to an output terminal of said circuit, a sixth source/drain region connected to a first reference voltage, and a third gate which is connected to said first and second gates and to a second reference voltage.

8. A circuit of claim 7 wherein said first enhancement type MOSFET is a P-channel MOSFET and said second enhancement type MOSFET is an N-channel MOSFET.

9. A circuit of claim 8 wherein said first reference voltage is ground voltage and said second reference voltage is a supply voltage.

10. A voltage level detecting circuit for detecting the voltage level of an input signal supplied thereto for supplying a high level output signal as its output when said input signal has been detected to be equal to or higher than a predetermined voltage level or a low level output signal when said input signal has been detected to be lower than said predetermined voltage level, comprising:

an input terminal for receiving said input signal;

at least one first enhancement type MOSFET having a first source/drain region connected to said input terminal, a second source/drain region, and a first gate connected to said first source/drain region;

a second enhancement type MOSFET having a third source/drain region connected to said second source/drain region of said first enhancement type MOSFET, a fourth source/drain region, and a second gate; and a third enhancement type MOSFET having a fifth source/drain region connected to said fourth source/drain region and to an output terminal of said circuit, a sixth source/drain region connected to a first reference voltage, and a third gate which is connected to said second gate and to a second reference voltage.

11. A circuit of claim 10 wherein said first and third MOSFETs are N-channel MOSFETs and said second MOSFET is a P-channel MOSFET.

12. A circuit of claim 11 wherein said first reference voltage is ground voltage and said second reference voltage is a supply voltage.

* * * * *